(12) United States Patent
Fukushima et al.

(10) Patent No.: US 7,461,182 B2
(45) Date of Patent: Dec. 2, 2008

(54) SETTING DEVICE PROGRAM AND METHOD FOR SETTING A MEMORY CONTROL

(75) Inventors: Toshiaki Fukushima, Yamato (JP); Yohichi Matsui, Komae (JP); Taichiroh Nomura, Sagamihara (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 586 days.

(21) Appl. No.: 10/730,321

(22) Filed: Dec. 8, 2003

(65) Prior Publication Data

US 2004/0267984 A1   Dec. 30, 2004

(30) Foreign Application Priority Data

Jun. 25, 2003   (JP) .............................. 2003-180841

(51) Int. Cl.
    *G06F 3/00* (2006.01)
(52) U.S. Cl. ........................ 710/33; 711/165; 710/13; 710/16
(58) Field of Classification Search ................. 711/115, 711/167; 710/13, 16, 33
    See application file for complete search history.

(56) References Cited

U.S. PATENT DOCUMENTS

| | | | | |
|---|---|---|---|---|
| 6,373,768 | B2 * | 4/2002 | Woo et al. .................... | 365/211 |
| 7,050,959 | B1 * | 5/2006 | Pollard et al. ................. | 703/21 |
| 2002/0144173 | A1 * | 10/2002 | Jeddeloh ...................... | 713/501 |
| 2002/0169922 | A1 * | 11/2002 | Thomann et al. ............ | 711/100 |
| 2003/0095464 | A1 * | 5/2003 | Huang .................... | 365/230.03 |
| 2005/0235110 | A1 * | 10/2005 | Mylly ......................... | 711/115 |

FOREIGN PATENT DOCUMENTS

| | | |
|---|---|---|
| JP | 07-141052 | 6/1995 |
| JP | 2000-293256 | 10/2000 |
| JP | 2005-507111 | 3/2005 |

* cited by examiner

*Primary Examiner*—Niketa I Patel
*Assistant Examiner*—Jasjit S Vidwan
(74) *Attorney, Agent, or Firm*—Anthony M. Del Zoppo, III; Driggs, Hogg, Daugherty & Del Zoppo Co., LPA

(57) ABSTRACT

A program for a setting device for setting a memory control device which, in part, acquires memory attribute information indicating an attribute of the memory module, a data transfer rate setting value as a rate of an upper limit value of a data transfer rate relative to a maximum data transfer rate, an upper limit value of the data transfer rate being at which the memory control device accesses the memory module, and the maximum data transfer rate being at which the memory control device is able to access the memory module. The setting device can appropriately control the heating value and the upper limit temperature for each of the plurality of memory modules mutually different in type though mutually compatible.

16 Claims, 4 Drawing Sheets

| MEMORY ATTRIBUTE INFORMATION | | | | MEMORY ATTACHMENT POSITION INFORMATION | DATA TRANSFER RATE SETTING VALUE CANDIDATE | |
|---|---|---|---|---|---|---|
| MANUFACTURER IDENTIFICATION INFORMATION | NUMBER-OF-DEVICES INFORMATION | MEMORY BANK INFORMATION | TYPE IDENTIFICATION INFORMATION | | UPPER LIMIT TEMPERATURE | |
| | | | | | 90°C | 80°C |
| AA COMPANY | 8 | ONE SIDE | SDRAM/DDR | MEMORY SLOT 1020a | 70% | 66% |
| | | | | MEMORY SLOT 1020b | 75% | 71% |
| | 16 | BOTH SIDES | SDRAM/DDR | MEMORY SLOT 1020a | 68% | 64% |
| | | | | MEMORY SLOT 1020b | 73% | 69% |
| | 8 | ONE SIDE | SDRAM/DDR | MEMORY SLOT 1020a | 68% | 64% |
| | | | | MEMORY SLOT 1020b | 73% | 69% |
| BB COMPANY | 16 | BOTH SIDES | SDRAM/DDR | MEMORY SLOT 1020a | 66% | 62% |
| | | | | MEMORY SLOT 1020b | 71% | 67% |
| | 8 | ONE SIDE | SDRAM/SDR | MEMORY SLOT 1020a | 70% | 66% |
| | | | | MEMORY SLOT 1020b | 75% | 71% |
| ... | ... | ... | ... | ... | ... | ... |

SETTING DEVICE PROGRAM AND METHOD FOR SETTING A MEMORY CONTROL

CROSS-REFERENCE TO RELATED APPLICATIONS

This application is one of two U.S. patent applications including filed application having Ser. No. 10/730,319 which was filed on the same date hereof and the teachings of which are incorporated herein by reference.

BACKGROUND OF THE INVENTION

1. Field of the Invention

The present invention relates, in general, to computers and computer equipment which gives increased control in thermally-related characteristics of component parts.

2. Description of Related Art

In recent years, an apparatus such as a personal computer has become widespread in use, and thus many of its parts, such as memory modules from one vendor or type, have become increasingly more common in terms of interoperability and/or compatibility with those of another. Thus, a manufacturer of the personal computer can use various types of memory modules (sources or forms) even for a single model or offering. Moreover, a user of the personal computer can often easily perform his own operation of replacing these types of parts for the purpose of changing performance of the apparatus.

Additionally, as it is known that information concerning certain component characteristics and insight, such as those of a memory module, is often available. For instance, information in an attribute memory can also be made available (e.g., SPD (Serial Presence Detect) information has been used heretofore; refer to PC SDRAM Serial Presence Detect (SPD) Specification.

The SPD information is stored in an attribute memory such as a serial ROM provided in the memory module, and therefore, the information processing apparatus or the like can appropriately specify a type and the like of a memory module attached thereto.

However, where there is a plurality of the memory modules which are mutually different in type, there also exists differences in thermal and heating values in accordance with the types thereof. Therefore, often the manufacturer or another similarly situated have set a data transfer rate for the memories across-the-board (ATB) for a single model in order that a temperature of a cabinet or similar for the product can meet a safety standard when a memory module having a higher heating value, but within the acceptable range for the product, is used. Therefore, even if a memory module have a heating value that is on a lower end of an acceptable range is used, memory performance is likely underutilized, because the data transfer rate for the memories is constant.

However, when a user replaces a memory module with another memory module, there exists the possibility that an unexpected increase in the generation of heat during operation results as though the replacement may be similar, due to the plurality of modules present, the type and/or manufacturer of the new combination are mutually different and potentially incompatible in combination due to overheating.

SUMMARY OF THE INVENTION

Accordingly, there is a need for an invention that overcomes the problems discussed above. The present invention has been achieved to solve the above technical problems, and accordingly an object thereof is to provide a setting device, an information processing apparatus, a setting method, a program and a recording medium, which are capable of solving the foregoing problem.

Specifically, according to a first aspect of the present invention, there is provided a program for a setting device for setting a memory control device which accesses a memory module implementing a memory device therein, comprising: a memory attribute information acquisition unit for acquiring memory attribute information indicating an attribute of the memory module from an attribute memory provided in the memory module; and a transfer rate setting unit for determining, based on the memory attribute information, a data transfer rate setting value as a rate of an upper limit value of a data transfer rate relative to a maximum data transfer rate, and for setting the determined data transfer rate setting value in the memory control device, the upper limit value of the data transfer rate being at which the memory control device accesses the memory module, and the maximum data transfer rate being at which the memory control device is able to access the memory module.

BRIEF DESCRIPTION OF THE DRAWINGS

Other aspects, features, and advantages of the present invention will become more fully apparent from the following detailed description, the appended claims, and the accompanying drawings in which:

FIG. 2(*b*) shows an example of a content of an attribute memory in accordance with an embodiment of the present invention;

FIG. 3 shows a data structure of a setting value candidate database in accordance with an embodiment of the present invention; and, FIG. 4 shows a flowchart of processing for setting a data transfer rate in the information processing apparatus in accordance with an embodiment of the present invention;.

DETAILED DESCRIPTION

Figure 1:
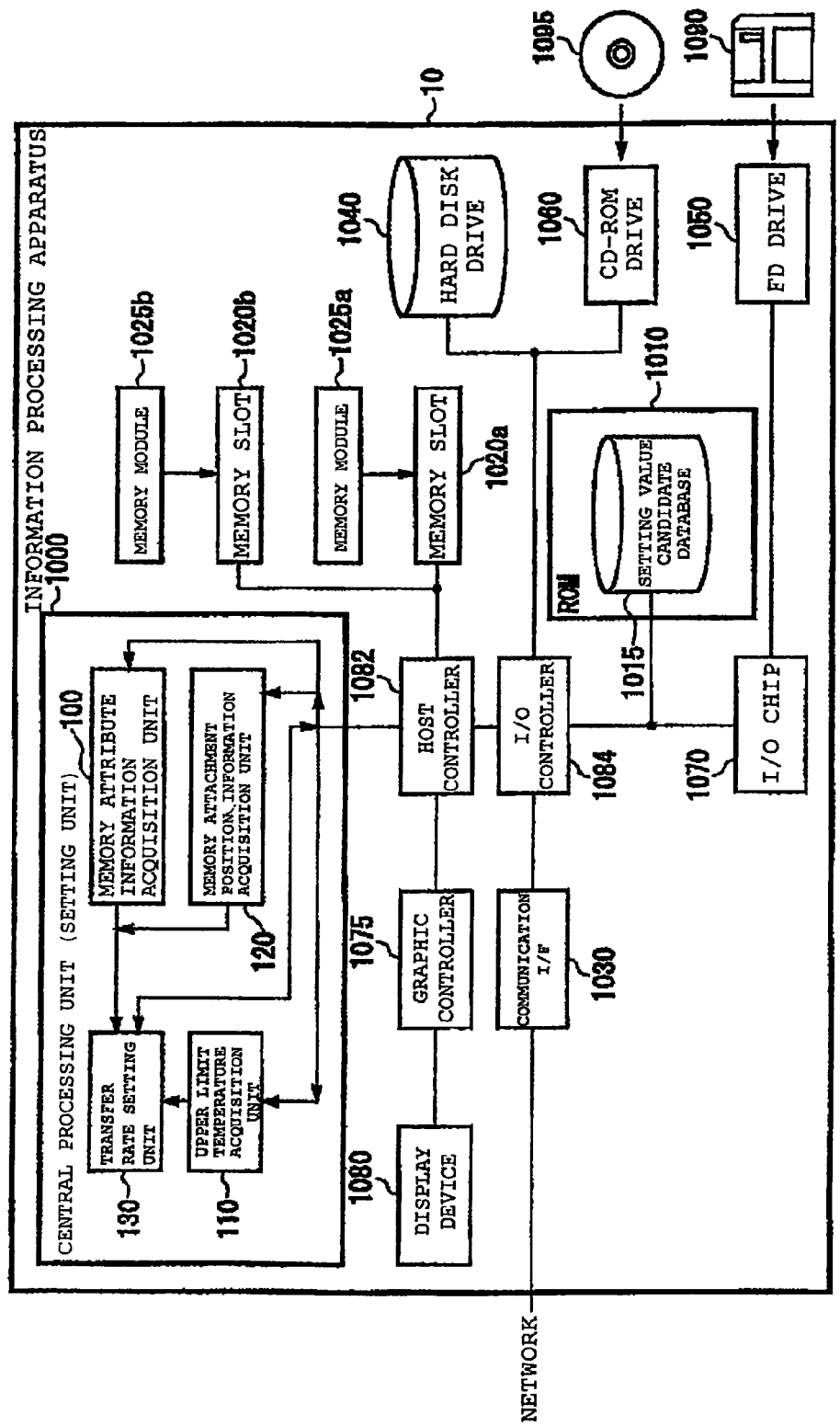
FIG. 1 is a block diagram of an information processing apparatus in accordance with an embodiment of the present invention.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures. The preferred embodiments of the present invention and its advantages are best understood by referring to the drawings, like numerals being used for like and corresponding parts of the various drawings. Embodiments of the present invention will now be described in detail with reference to the accompanying drawings.

FIG. 1 is a block diagram of an information processing apparatus 10 in accordance with an embodiment of the present invention;. The information processing apparatus 10 sets data transfer rates at which a host controller 1082 accesses memory modules 1025*a* and 1025*b* in accordance with attributes of the memory modules 1025*a* and 1025*b*, thus preventing the memory modules 1025*a* and 1025*b* from overheating.

The information processing apparatus 10 includes a CPU and its peripheral section having a central processing unit 1000, memory slots 1020*a* and 1020*b*, a graphic controller 1075, and a display device 1080, which are interconnected by the host controller 1082 as an example of a memory control device, an input/output section having a communication interface 1030, a hard disk drive 1040, and a CD-ROM drive 1060, which are connected to the host controller 1082 by an I/O controller 1084, and a legacy input/output section having a ROM 1010, a flexible disk drive 1050, and an I/O chip 1070, which are connected to the I/O controller 1084.

The central processing unit 1000 executes a program stored in the ROM 1010, and thus functions as a memory attribute information acquisition unit 100, an upper limit temperature acquisition unit 110, a memory attachment position information acquisition unit 120, and a transfer rate setting unit 130. Note that, in this example shown in FIG. 1, the setting device is realized when the central processing unit 1000 executes the program. Alternatively, in another aspect of an embodiment, the setting device may be another device which is provided separately from the central processing unit 1000 and performs approximately the same function as that of the central processing unit 1000. Specifically, the information processing apparatus 10 may include an LSI device or the like functioning as the setting device.

The memory attribute information acquisition unit 100 acquires memory attribute information indicating an attribute of the memory module 1025a from an attribute memory provided in the memory module 1025a, and sends the acquired memory attribute information to the transfer rate setting unit 130. Note that, when a plurality of the memory modules are attached into the information processing apparatus 10, the memory attribute information acquisition unit 100 may acquire the memory attribute information individually from the plurality of memory modules, for example, the memory modules 1025a and 1025b in association therewith.

The upper limit temperature acquisition unit 110 acquires an upper limit temperature at which the memory module 1025a is operated externally through the host controller 1082, and sends the acquired upper limit temperature to the transfer rate setting unit 130. For example, the upper limit temperature acquisition unit 110 may acquire the upper limit temperature based on an entry from a user, or may acquire the upper limit temperature from another device through a network and the communication interface 1030.

The memory attachment position information acquisition unit 120 acquires, from the memory slots 1020a and 1020b, memory attachment position information indicating into which memory slot of the information processing apparatus 10 the memory module 1025a is attached, and specifically, indicating into which of the memory slots 1020a and 1020b the memory module 1025a is attached. Then, the memory attachment position information acquisition unit 120 sends the acquired memory attachment position information to the transfer rate setting unit 130. Note that, when the plurality of memory modules are attached into the information processing apparatus 10, the memory attachment position information acquisition unit 120 may acquire the memory attachment position information individually from the plurality of memory modules, for example, the memory modules 1025a and 1025b in association therewith.

The data transfer rate setting value is a rate of an upper limit value of the data transfer rate at which the host controller 1082 accesses the memory module 1025a relative to a maximum data transfer rate at which the host controller 1082 can access the memory module 1025a. The transfer rate setting unit 130 determines this data transfer rate setting value based on the memory attribute information received from the memory attribute information acquisition unit 100 and the memory attachment position information received from the memory attachment position acquisition unit 120. Then, the transfer rate setting unit 130 sets the determined data transfer rate setting value in the host controller 1082.

Specifically, the transfer rate setting unit 130 acquires, from a setting value candidate database 1015, a data transfer rate setting value for maintaining a temperature of the memory module 1025a at a temperature equal to or lower than the upper limit temperature received from the upper limit temperature acquisition unit 110, based on the memory attribute information and the memory attachment position information. Then, the transfer rate setting unit 130 sets the acquired data transfer rate setting value in the host controller 1082. In place of this, the transfer rate setting unit 130 may set the data transfer rate setting value in the host controller 1082 based on the memory attribute information and the memory attachment position information irrespective of the data transfer rate setting values stored in the setting value candidate database 1015.

Moreover, the transfer rate setting unit 130 may determine the data transfer rate setting value for maintaining the memory module 1025a at a predetermined temperature or lower based on the memory attribute information and the memory attachment position information irrespective of the upper limit temperature received from the upper limit temperature acquisition unit 110, and then may set the determined data transfer rate in the host controller 1082. The predetermined temperature may be the upper limit temperature of the memory module 1025a determined in order that an upper limit temperature of the cabinet of the information processing apparatus 10 can be made to conform to a safety standard such as the UL standard.

Furthermore, when the plurality of memory modules are attached into the information processing apparatus 10 and it is possible to set only one data transfer rate for the whole of the plurality of memory modules, the data transfer rate setting values may be determined by the following method. First, the transfer rate setting unit 130 creates individual setting values as data transfer rate setting values set when the memory modules are singly attached into the information processing apparatus for each of the plurality of memory modules. Then, as the data transfer rate setting value for the whole of the plurality of memory modules, the transfer rate setting unit 130 may set a value between the maximum and minimum values of the individual setting values, each of which is created so as to correspond to each of the plurality of memory modules.

Alternatively, in another aspect of a preferred embodiment, the data transfer rate setting value for the whole of the plurality of memory modules, the transfer rate setting unit 130 may set the minimum value of the individual setting values, each of which is created so as to correspond to each of the plurality of memory modules. Thus, the transfer rate setting unit 130 can make the temperature of the memory modules conform to the safety standard more securely.

Note that the maximum data transfer rate is the maximum data transfer rate when the memory modules are accessed, which is determined in accordance with a combination of specifications of the host controller and specifications of the memory modules. For example, the maximum data transfer rate is a value determined in accordance with an operation mode and operation frequency of the memory. In this case, the operation mode is, for example, one indicating whether the memory module is a SDR DIMM or a DDR DIMM. For example, when the operation mode and operation frequency of the memory are determined, the maximum data transfer rate is determined to be a value obtained by multiplying the operation frequency of the memory by a data width of the memory. Meanwhile, the data transfer rate setting value is, for example, a value designating an occupation rate of clock cycles to be actually used for accessing the memory among a predetermined number of the clock cycles, while maintaining the operation frequency in the maximum data transfer rate.

The ROM 1010 stores a boot program executed by the central processing unit 1000 at the time of activation of the information processing apparatus 10, a BIOS program depending on hardware of the information processing apparatus 10, and the like. For example, the ROM 1010 stores a program for allowing the central processing unit 1000 to function as the setting device, and supplies the program to the central processing unit 1000.

Moreover, the ROM 1010 has the setting value candidate database 1015, and sends data in the setting value candidate database 1015 to the data transfer rate setting unit 130 through the I/O controller 1084 and the host controller 1082. The setting value candidate database 1015 stores the data transfer rate setting value candidates determined so as to correspond to the memory attribute information and the memory attachment position information in order to maintain the memory module 1025a at the upper limit temperature or lower.

The memory slot 1020a has the memory module 1025a attached thereto, and allows the host controller 1082 to access the memory module 1025a. The memory slot 1020b is approximately the same as the memory slot 1020a except that the memory module 1025b is attached thereto in place of the memory module 1025a, and therefore, description thereof is not essential.

The memory module 1025a is attached into any of the memory slots provided in the information processing apparatus 10, for example, into the memory slot 1020a. Moreover, the memory module 1025a is accessed from the host controller 1082 through the memory slot 1020a, and transfers stored data to the central processing unit 1000 and the like. Meanwhile, the memory module 1025a is accessed from the host controller 1082 through the memory slot 1020a, and stores data transferred from the central processing unit 1000 and the like. The memory module 1025b is approximately the same as the memory module 1025a except that the memory module 1025b is attached into the memory slot 1020b in place of the memory slot 1020a, and therefore, description thereof is not essential.

The host controller 1082 connects the memory slots 1020a and 1020b to the central processing unit 1000 and the graphic controller 1075, which access the memory modules 1025a and 1025b at a high transfer rate. The central processing unit 1000 is operated based on the programs stored in the ROM 1010 and the memory modules 1025a and 1025b, and controls the respective units.

The graphic controller 1075 acquires image data created by the central processing unit 1000 and the like on frame buffers provided in the memory modules 1025a and 1025b, and allows images from the image data to be displayed on the display device 1080. Alternatively, in another aspect of a preferred embodiment, the graphic controller 1075 may include therein a frame buffer storing the image data created by the central processing unit 1000.

The I/O controller 1084 connects the host controller 1082 to the communication interface 1030, the hard disk drive 1040 and the CD-ROM drive 1060, which are relatively high-speed input/output devices. The communication interface 1030 communicates with other devices through the network.

The hard disk drive 1040 stores a program and data for use in the information processing apparatus 10. The CD-ROM drive 1060 reads a program or data from a CD-ROM 1095, and provides the read program or data to the I/O chip 1070 through the memory modules 1025a and 1025b.

Moreover, relatively low-speed input/output devices such as the ROM 1010, the flexible disk drive 1050 and the I/O chip 1070 are connected to the I/O controller 1084. The flexible disk drive 1050 reads a program or data from the flexible disk drive 1090, and provides the read program or data to the I/O chip 1070 through the memory modules 1025a and 1025b. The I/O chip 1070 connects the flexible disk drive 1090 and other various input/output devices to the information processing apparatus 100 through, for example, a parallel port, a serial port, a keyboard port, a mouse port etc.

The program provided to the information processing apparatus 10 is stored in a recording medium such as the flexible disk 1090, the CD-ROM 1095 and an IC card, and provided by a user. The program is read out from the recording medium, installed in the information processing apparatus 10 through the I/O chip 1070 or the like, and executed in the information processing apparatus 10.

A program installed in the information processing apparatus 10 and executed thereby includes a memory attribute information acquisition module, an upper limit temperature acquisition module, a memory attachment position information acquisition module, and a transfer rate setting module. Operations which the respective modules allow the information processing apparatus 10 to perform are the same as operations of members corresponding thereto in the above-described information processing apparatus 1000, and therefore, description thereof will be omitted.

The program or modules described above may be stored in an external recording medium. As the recording medium, an optical recording medium such as a DVD and a PD, a magneto-optical recording medium such as a MD, a tape medium, a semiconductor memory such as an IC card, or the like can be used as well as the flexible disk 1090 and the CD-ROM 1095. Moreover, a storage device such as a hard disk and a RAM, which is provided in a server system connected to a dedicated communication network or the Internet, may be used as such a recording medium, and the program may be provided to the information processing apparatus 10 through the network.

Figure 2:
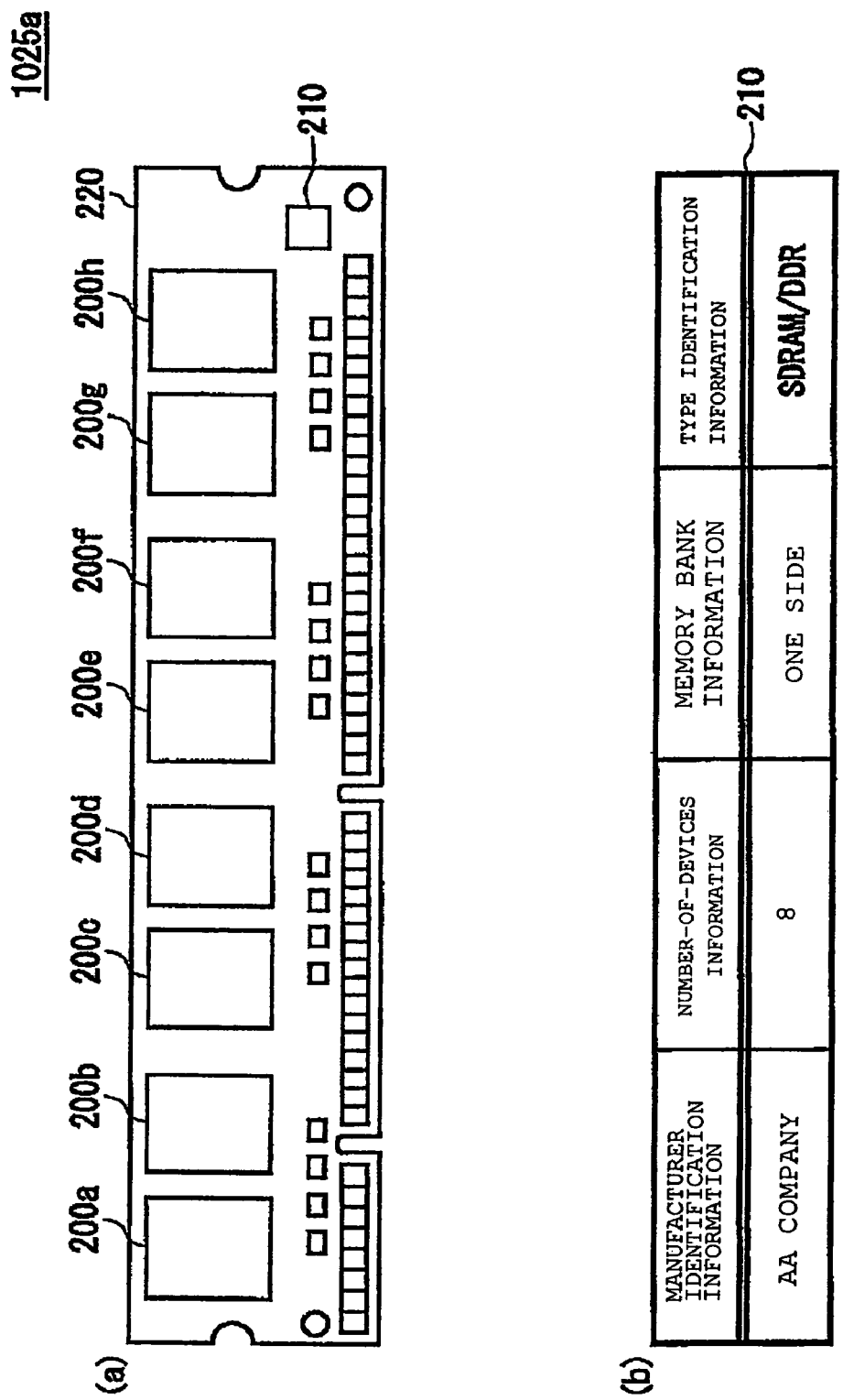
FIG. 2(*a*) shows an example of a memory module in accordance with an embodiment of the present invention.

FIG. 2(*a*) shows an example of the memory module 1025a in accordance with an embodiment of the present invention;. The memory module 1025a includes memory devices 200a to 200h, each of which is an LSI such as a memory chip, an attribute memory 210 storing the memory attribute information of the memory module 1025a, and a board 220 on a single side of which the memory devices 200a to 200h are implemented.

From FIG. 2(*a*), the memory module 1025a is a memory module of single-sided implementation, which has the memory devices 200a to 200h implemented on the single side of the board 220. In place of this, the memory module 1025b may be a memory module of double-sided implementation, which has the memory devices implemented on both sides of the board 220.

FIG. 2(*b*) shows an example of a content of the attribute memory 210 in accordance with an embodiment of the present invention;. The attribute memory 210 stores, as the memory attribute information, manufacturer identification information identifying a manufacturer who has manufactured the memory module 1025a or the memory devices 200a to 200h, number-of-devices information indicating the number of memory devices 200 implemented in the memory module 1025a, memory bank information indicating whether the memory module 1025a is the memory module of the single-sided implementation or of the double-sided implementation, and type identification information identifying a type of the memory module 1025*a* or of the memory devices 200*a* to 200*h*.

For example, the attribute memory individually stores information identifying an AA company as the manufacturer identification information, eight as the number-of-devices information, information indicating that the memory module 1025*a* is the memory module of the single-sided implementation as the memory bank information, and information indicating that a type of the memory module 1025*a* is DDR SDRAM as the type identification information.

The memory attribute information acquisition unit 100 acquires, from the attribute memory 210, the manufacturer identification information, the number-of-devices information, the memory bank information, and the type identification information. Note that the attribute memory 210 may store information for specifying the memory attribute information shown in this drawing in place of directly storing the memory attribute information shown in this drawing. For example, the attribute memory 210 may store, as the memory attribute information, a parts number as a number identifying the type of the memory module 1025*a*, the parts number having been determined by the manufacturer of the memory module 1025*a*. In this case, the memory attribute information acquisition unit 100 acquires the parts number from the attribute memory 210, thus making it possible to specify the memory attribute information associated with the parts number.

More specifically, in a preferred aspect, the attribute memory 210 may include, as the number-of-devices information, information for specifying the number of devices in place of the information directly indicating the number of devices. For example, the attribute memory 210 may store a bit width of data accessible by the host controller 1082 to the memory module 1025*a*, a bit width of the data stored in the memory device, and the number of memory banks in the memory module 1025*a*. In this case, the memory attribute information acquisition unit 100 can specify the number-of-devices information based on these pieces of information. For example, when the bit width of the data accessible by the host controller 1082 to the memory module 1025*a* is 64 bits, the bit width of the data stored in each memory device is 16 bits, and the number of memory banks is two, the memory attribute information acquisition unit 100 can specify the number-of-devices information as that the number of memory devices is eight by performing calculation of "64/16 2".

In this exemplary aspect, the attribute memory 210 stores the information indicating the memory type of the memory module. In place of this, or in addition thereto, the attribute memory 210 may store other information as the type identification information. For example, as the type identification information, the attribute memory 210 may store information indicating a manufacturing region of the memory devices or the memory module, information indicating a manufacturing technology of the memory devices or the memory module, a revision number of the memory module, a step number indicating a more detailed design step in the same revision, information indicating thicknesses of signal lines of the memory devices, information indicating an operating voltage, information indicating a time required for the access, information concerning an operating frequency or signal characteristics for accessing the memory devices, for example, an allowable range of a clock waveform, and the like. Moreover, as the type identification information, the attribute memory 210 may store information indicating a memory capacity of the memory module, and information indicating the number of bits as access units of the data of the memory devices or a depth of an address as a total number of the access units configuring the memory devices. As an example, the attribute memory 210 may store SPD (Serial Presence Detect) information as the memory attribute information.

FIG. 3 shows a data structure of the setting value candidate database 1015 in accordance with an embodiment of the present invention. The setting value candidate database 1015 stores the data transfer rate setting values determined so as to correspond to the memory attribute information and the memory attachment position information in order to maintain the memory module 1025*a* or 1025*b* at the upper limit temperature or lower.

For example, the setting value candidate database 1015 stores the data transfer rate setting value candidates to be candidates for the data transfer rate setting values in association with the manufacturer identification information, the number-of-devices information, the memory bank information, the type identification information, and the memory attachment position information. Moreover, the setting value candidate database 1015 stores the data transfer rate setting value candidates in association with the upper limit temperatures of the memory modules.

More specifically, with regard to the memory module, in which the manufacturer is the AA company, the number of memory devices is eight, and which is of the single-sided implementation, is a DDR SDRAM, and is attached into the memory slot 1020*a*, the setting value candidate database 1015 stores 70% as a data transfer rate setting value in which the memory module is maintained at 90 C as the upper limit temperature or lower.

Thus, the transfer rate setting unit 130 can acquire, from the setting value candidate database 1015, the data transfer rate setting value candidate corresponding to the acquired manufacturer identification information, number-of-devices information, memory bank information, type identification information, memory attachment position information and upper limit temperature, and can set the acquired data transfer rate setting value candidate as the data transfer rate setting value in the host controller 1082.

Here, in a preferred aspect, with regard to the memory module, in which the manufacturer is the AA company, the number of memory devices is 16, and which is of the double-sided implementation, is a DDR SDRAM, and is attached into the memory slot 1020*a*, the setting value candidate database 1015 stores 68% as the data transfer rate setting value in which the memory module is maintained at 90 C as the upper limit temperature or lower.

In this example, in the case of setting the same upper limit temperature, the data transfer rate setting value candidate when the number of memory devices is smaller than the data transfer rate setting value candidate when the number of memory devices is smaller. Specifically, the transfer rate setting unit 130 determines, as the data transfer rate setting value, a smaller value in the case where the number of memory devices, which is indicated by the number-of-devices information, is larger, as compared with that of the case where the number of memory devices, which is indicated by the number-of-devices information, is smaller.

Thus, for example, when a heating value per data transfer rate is increased in accordance with the number of memories, the transfer rate setting unit 130 can lower the data transfer rate setting value in order to set the memory module 1025*a* at the upper limit temperature or lower.

Moreover, in this example, in the case of setting the same upper limit temperature, the data transfer rate setting value candidate in the case of the memory module of the double-sided implementation is smaller than the data transfer rate setting value candidate in the case of the memory module of the single-sided implementation. Specifically, the transfer rate setting unit 130 determines, as the data transfer rate setting value, a smaller value in the case where the memory bank information indicates the memory module of the double-sided implementation as compared with that of the case where the memory bank information indicates the memory module of the single-sided implementation.

Thus, for example, when the heating value per data transfer rate is increased in accordance with the number of sides on which the memory devices are implemented, the transfer rate setting unit 130 can lower the data transfer rate setting value in accordance with the number of sides on which the memory devices are implemented in order to set the memory module 1025*a* at the upper limit temperature or lower.

In place of this, the transfer rate setting unit 130 may determine, as the data transfer rate setting value, a smaller value in the case where the memory bank information indicates the memory module of the single-sided implementation as compared with that of the case where the memory bank information indicates the memory module of the double-sided implementation. Thus, even in the case where the heating value of the memory module of the single-sided implementation is larger as compared with that of the memory module of the double-sided implementation due to conditions such as the total memory capacity of the memory module, the temperature of the memory module can be kept at the upper limit temperature or lower. Specifically, the magnitude of the data transfer rate set in accordance with the memory bank information is not limited to the example of this table, and the transfer rate setting unit 130 may determine the data transfer rate setting value in accordance with the memory bank information.

Moreover, with regard to the memory module, in which the manufacturer is a BB company, the number of memory devices is eight, and which is of the single-sided implementation, is a DDR SDRAM, and is attached into the memory slot 1020*a*, the setting value candidate database 1015 stores 68% as the data transfer rate setting value in which the memory module is maintained at 90 C as the upper limit temperature or lower.

In a preferred aspect, the transfer rate setting unit 130 can determine values different depending on the manufacturer identification information as the data transfer rates, and can set the determined values in the host controller 1082. Thus, for example, when the heating value per data transfer rate of the memory module of the BB company is larger as compared with that of the memory module of the AA company, the transfer rate setting unit 130 can appropriately determine the data transfer rate setting value in order to set the memory module 1025*a* at the upper limit temperature or lower.

Furthermore, with regard to the memory module, in which the manufacturer is the BB company, the number of memory devices is eight, and which is of the single-sided implementation, is a DDR SDRAM, and is attached into the memory slot 1020*a*, the setting value candidate database 1015 stores 70% as the data transfer rate setting value in which the memory module is maintained at 90 C as the upper limit temperature or lower.

In a preferred embodiment, the transfer rate setting unit 130 can determine the data transfer rate setting value in accordance with the type identification information, and can set the determined value in the host controller 1082. Thus, for example, when the DDR memory module has a larger heating value per data transfer rate setting value as compared with that of the SDR memory module, the transfer rate setting unit 130 can appropriately set the data transfer rate setting value in order to set the memory module 1025*a* at the upper limit temperature or lower. In place of this, the transfer rate setting unit 130 may determine the data transfer rate setting value in accordance with the other type identification information described with reference to FIG. 2, for example, the revision number and the like.

As described above, as a setting for maintaining the memory module 1025*a* at the upper limit temperature or lower, the transfer rate setting unit 130 can determine, as the data transfer rate, a smaller value in the case where the heating value of the memory module 1025*a*, which is determined in accordance with the memory attribute information, is larger as compared with that of the case where the heating value of the memory module 1025*a*, which is determined in accordance with the memory attribute information, is smaller. Then, the transfer rate setting unit 130 can set the determined value in the host controller 1082. Thus, an operating temperature of the memory module can be made to conform to a safety standard in which the upper limit temperature of the memory module is determined.

Furthermore, with regard to the memory module, in which the manufacturer is the AA company, the number of memory devices is eight, and which is of the single-sided implementation, is a DDR SDRAM, and is attached into the memory slot 1020*b*, the setting value candidate database 1015 stores 75% as the data transfer rate setting value in which the memory module is maintained at 90 degrees Centrigrade (C) as the upper limit temperature or lower.

For example, in the case of keeping the temperature of the cabinet of the information processing apparatus 10 at the predetermined temperature or lower, this table shows that heat generation of the memory slot 1020*b* is more allowable as compared with that of the memory slot 1020*a* when the memory slot 1020*a* is provided adjacent to the cabinet of the information processing apparatus 10 and the memory slot 1020*b* is provided more separate from the cabinet of the information processing apparatus 10.

In this case, the transfer rate setting unit 130 can set the data transfer rate setting value higher in the case where the memory module is attached into the memory slot farther from the cabinet as compared with the case where the memory module is attached into the memory slot closer to the cabinet.

In an alternative embodiment, the transfer rate setting unit 130 may determine the data transfer rate setting value in accordance with a distance from the memory slot to the central processing unit 1000. In this case, when the data transfer rate setting value is prone to be affected by heat by the central processing unit 1000, the data transfer rate setting value can be lowered. Furthermore, heat radiation of the central processing unit 1000 can be prevented from being hindered, thus making it possible to prevent the central processing unit 1000 from a thermal runaway and a breakage due to the heat.

Moreover, when the memory slot 1020*a* is provided adjacent to a portion in the cabinet of the information processing apparatus 10, which is easy to be touched by a user, and the memory slot 1020*b* is provided adjacent to a portion in the cabinet of the information processing apparatus 10, which is difficult to be touched by a user, this table may show that the heating value of the memory slot 1020*b* is more allowable as compared with that of the memory slot 1020*a*.

In this case, the transfer rate setting unit 130 can set the data transfer rate setting value higher in the case where the memory module is attached into the memory slot provided adjacent to the portion difficult to be touched by a user as compared with the case where the memory module is attached into the memory slot easy to be touched by a user.

When the information processing apparatus 10 is a notebook type personal computer, the portion difficult to be touched by a user is, for example, a back thereof in contact with a footprint, and the portion easy to be touched by a user is, for example, an exposure surface thereof such as a keyboard. Moreover, as another example, the transfer rate setting unit 130 may set the data transfer rate setting value in accordance with a safety standard predetermined in accordance with whether the memory slot is provided adjacent to the back or the exposure surface no matter whether the portion is difficult or easy to be touched by a user.

As still another example in a preferred embodiment, the transfer rate setting unit 130 may set a value determined based on reliability of the operation of the memory module as the data transfer rate setting value. For example, the transfer rate setting unit 130 may set, as the data transfer rate setting value, a value determined based on a value such as a MTBF determined in accordance with the heat generation of the memory module.

Figure 4:
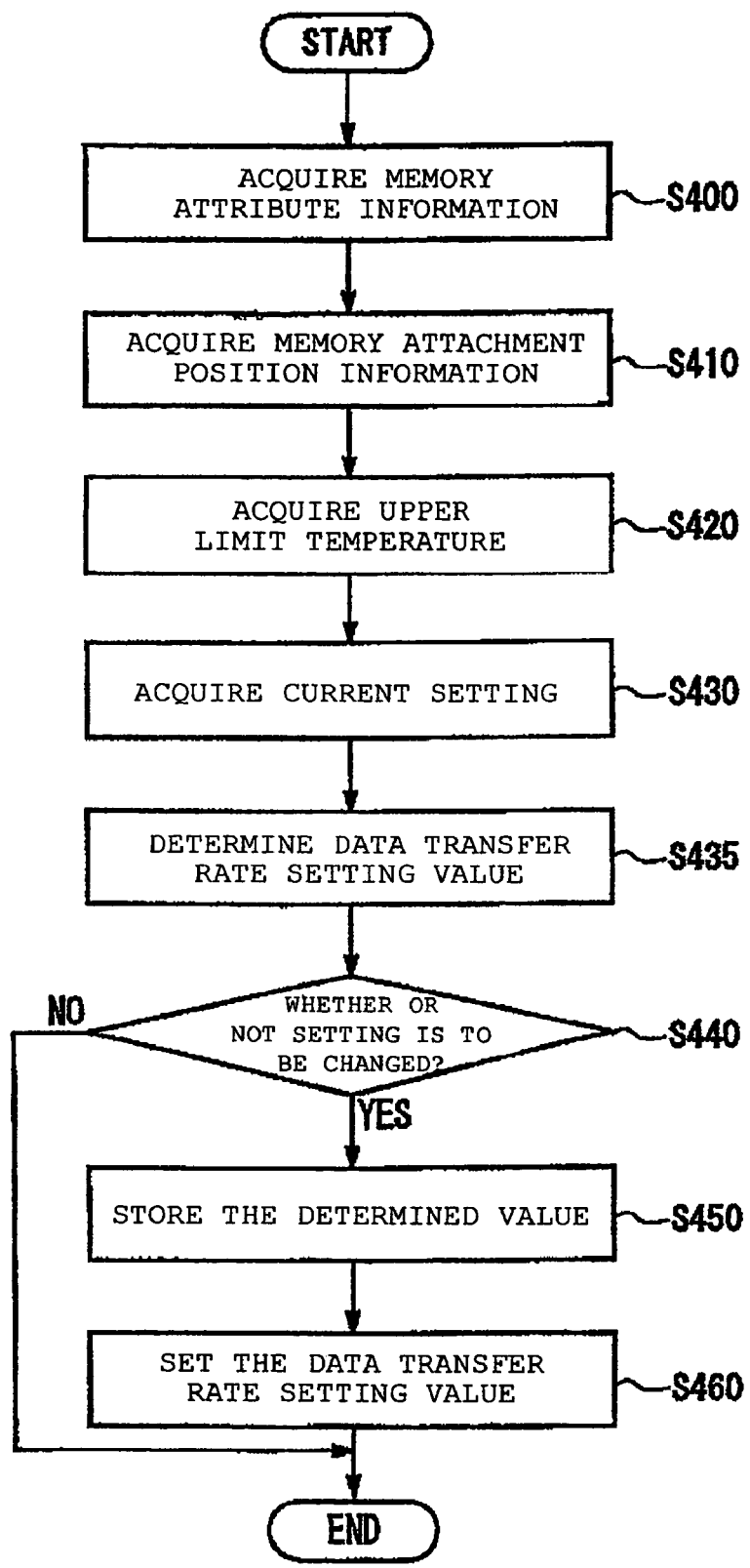

FIG. 4 shows a flowchart of processing for setting the data transfer rate in the information processing apparatus 10 in accordance with an embodiment of the present invention;. The information processing apparatus 10 performs the following processing when a power supply of the information processing apparatus 10 is turned on to perform activation processing or periodically after the activation. The memory attribute information acquisition unit 100 acquires the memory attribute information indicating the attribute of the memory module 1025a from the attribute memory provided in the memory module 1025a (S400).

The memory attachment position information acquisition unit 120 acquires, from the memory slots 1020a and 1020b, the memory attachment position information indicating into which memory slot of the information processing apparatus 10 the memory module 1025a is attached (S410). The upper limit temperature acquisition unit 110 acquires the upper limit temperature at which the memory module 1025a is operated (S420).

The transfer rate setting unit 130 acquires, from the host controller 1082 or the like, the existing setting value as a current data transfer rate setting value already set (S430). Then, the transfer rate setting unit 130 determines the data transfer rate setting value by acquisition of a candidate therefor from the setting value candidate database 105 based on the acquired memory attribute information, memory attachment position information, and upper limit temperature (S435). Subsequently, the transfer rate setting unit 130 determines whether or not the acquired data transfer rate setting value and the existing setting value are different from each other, thus determining whether or not the data transfer rate setting value is to be changed (S440).

If the data transfer rate setting value is not to be changed (S440: NO), the transfer rate setting unit 130 terminates the processing. If the data transfer rate setting value is to be changed (S440: YES), the transfer rate setting unit 130 stores the data transfer rate setting value acquired from the setting value candidate database 1015 in a register or the like in the host controller 1082 (S450), thus setting the data transfer rate setting value (S460).

As a concrete example of a setting method for the data transfer rate setting value, the transfer rate setting unit 130 may perform the following processing. For example, the transfer rate setting unit 130 may determine an upper limit value of the number of memory accesses issued by the host controller 1082 per unit time as the data transfer rate setting value based on the memory attribute information, and may set the determined upper limit value in the register or the like in the host controller 1082. Specifically, based on the memory attribute information, the transfer rate setting unit 130 may determine a value indicating the number of idle cycles while the host controller 1082 is not performing the memory accesses, each idle cycle being inserted between one cycle while the host controller 1082 is performing the memory access and the other, and may set the determined value in the memory control device. Thus, the transfer rate setting unit 130 may set the data transfer rate setting value in the host controller 1082. The data transfer rate set here is an amount of data transferred between the memory module 1025a and the central processing unit 1000 per unit time, for example, a band width indicating the number of bits or the number of bytes.

Upon receiving the setting from the transfer rate setting unit 130, for example, the host controller 1082 controls the memory accesses as described below. After performing normal accesses for a predetermined period of time, the host controller 1082 detects the number of cycles while the memory accesses have actually been being performed for the predetermined period of time. Then, the host controller 1082 calculates a rate of the number of cycles while the memory accesses have actually been being performed relative to the total number of cycles for the predetermined period of time. When the calculated rate exceeds the data transfer rate setting value, the host controller 1082 inserts an idle cycle while the memory access is not being performed into a period from that time to the elapse of a predetermined period, and resumes the memory access after the lapse of the predetermined period.

Moreover, also when the data transfer rate setting value cannot be acquired from the setting value candidate database 1015, the transfer rate setting unit 130 may determine that the data transfer rate setting value is to be changed based on the memory attribute information, the memory attachment position information, and the upper limit temperature (S440: YES). In this case, the transfer rate setting unit 130 sets a data transfer rate setting value for enabling any normal memory module attachable into the information processing apparatus 10 to be maintained at the upper limit temperature or lower.

In this embodiment, the information processing apparatus 10 acquires the memory attribute information from the attribute memory provided in the memory module, and sets the data transfer rate determined based on the memory attribute information in the host controller 1082. Thus, the information processing apparatus 10 can set the data transfer rate setting value at a smaller value when the heating value of the memory module, which is determined in accordance with the memory attribute information, is larger in order to control the temperature of the memory module at the predetermined upper limit temperature or lower.

More specifically, the information processing apparatus 10 sets the data transfer rate setting value according to the heating value determined in accordance with the number of memory devices implemented in the memory module, an implementation state of the memory devices, the type of the memory devices or memory module (for example, the memory type, the manufacturing technology and the like), and the manufacturer of the memory devices or memory module. Thus, even in such a case where the memory module is replaced with another, the information processing apparatus 10 can appropriately control the heating value and the upper limit temperature for each of the plurality of memory modules mutually different in type though mutually compatible.

Additionally, the configuration described in the above-described embodiments is but exemplary. It will be further understood that various changes in the details, materials, configurations and arrangements of the parts which have been described and illustrated in order to explain the nature of this invention may be made by those skilled in the art without departing from the principle and scope of the invention as expressed in the following claims.

According to the embodiment described above, setting devices, information processing apparatuses, a setting method, a program, and a recording medium, which are described in the respective items below, are realized.

As obvious from the above description, according to the present invention, the access to the memory module can be appropriately controlled.

Although the preferred embodiments of the present invention have been described in detail, it should be understood that various changes, substitutions and alternations can be made therein without departing from spirit and scope of the inventions as defined by the appended claims.

What is claimed is:

1. A method, comprising:
   receiving memory module attribute information from attribute memories in each memory module in the multiple memory modules;
   receiving memory attachment position information that indicates memory slots to which each of the multiple memory modules is attached;
   receiving an upper limit temperature at which each memory module in the multiple memory modules is operated;
   individually determining data transfer rates for each memory module in the multiple memory modules based at least in part upon all of the corresponding received memory module attribute information, the received upper limit temperature, and the received attachment position information; and
   collectively setting a data transfer rate with respect to the multiple memory modules based at least in part on the individually determined data transfer rates, wherein collectively setting the data transfer rate with respect to the multiple memory modules comprises:
      determining a maximum data transfer rate with respect to data transfer rates determining for each memory module;
      determining a minimum data transfer rate with respect to data transfer rates determining for each memory module; and
      collectively setting a data transfer rate with respect to the multiple memory modules as a value that is between the maximum data transfer rate and the minimum data transfer rate.

2. The method of claim 1, wherein the data transfer rate set collectively for the multiple memory modules is an upper limit value of a data transfer rate at which a host controller accesses one of the multiple memory modules relative to a maximum data transfer rate at which the host controller can access the one of the multiple memory modules.

3. The method of claim 1, wherein determining data transfer rates individually for each memory module in the multiple memory modules comprises:
   accessing a setting value candidate database;
   retrieving a candidate data transfer rate from the setting value candidate database for at least one memory module in the multiple memory modules, the candidate data transfer rate from the setting value candidate database is located based at least in part upon memory attribute information stored in the at least one memory module;
   determining a current data transferring rate, which is the data transfer rate currently being used to transfer data;
   comparing the current and the candidate data transfer rates; and
   setting the data transfer rate based on the comparison.

4. The method of claim 3, wherein determining data transfer rates individually for each memory module in the multiple memory modules further comprises:
   retrieving data transfer rates from the setting value candidate database for each memory module in the multiple memory modules, the data transfer rates from the setting value candidate database are located based at least in part upon memory attribute information stored in each of the memory modules, respectively.

5. The method of claim 1, wherein collectively setting the data transfer rate with respect to the multiple memory modules comprises:
   determining a minimum data transfer rate with respect to data transfer rates determined for each memory module; and
   using the minimum data transfer rate as the collective data transfer rate for the multiple memory modules.

6. The method of claim 1, wherein setting a data transfer rate with respect to the multiple memory modules collectively comprises transferring the data transfer rate with respect to the multiple memory modules to a host controller.

7. The method of claim 1, wherein the attribute information within at least one memory module of the multiple memory modules includes manufacturer identification information that indicates a manufacturer of the at least one memory module, number-of-devices information that indicates a number of devices on the at least one memory module, memory bank information that indicates whether the at least one memory module is of a single-sided or of a double-sided implementation, and type identification information that identifies a type of the at least one memory module.

8. An apparatus, comprising:
   a memory that includes instructions for:
      acquiring first memory attribute information for a first memory module from an attribute memory in the first memory module;
      acquiring second memory attribute information for a second memory module from an attribute memory in the second memory module, wherein the acquired first memory attribute information and the acquired second memory attribute information include Serial Presence Detect information;
      accessing a setting value candidate database;
      determining a first data transfer rate setting value for the first memory module based at least in part upon the acquired first memory attribute information using at least a portion of the first memory attribute information as an index with respect to contents of the setting value candidate database to determine the first data transfer rate setting value;
      determining a second data transfer rate setting value for the second memory module based at least in part upon the acquired second memory attribute information using at least a portion of the second memory attribute information as an index with respect to contents of the setting value candidate database to determine the second data transfer rate setting value;
      analyzing the first data transfer rate setting value and the second data transfer rate setting value;
      determining a data transfer rate setting value that is to be applied to the first memory module and the second memory module based at least in part upon the analysis of the first data transfer setting value and the second data transfer rate setting value; and storing the data transfer rate setting value that is to be applied to the first memory module and the second memory module; and a processor that is configured to execute the instructions in memory.

9. The apparatus of claim 8, wherein the memory comprises further instructions for selecting a data transfer rate setting value that is between the first data transfer rate setting value and the second data transfer rate setting value.

10. The apparatus of claim 8, wherein the memory comprises further instructions for:

determining which of the first data transfer rate setting value and the second data transfer rate setting value is lower; and selecting the lower data transfer rate setting value as the data transfer rate setting value that is to be applied to the first memory module and the second memory module.

11. The apparatus of claim 8, wherein the memory comprises additional instructions for:

acquiring first memory attachment position information that is indicative of a memory slot to which the first memory module is attached;

acquiring second memory attachment position information that is indicative of a memory slot to which the second memory module is attached;

determining the first data transfer rate setting value based at least in part upon the first memory attribute information and the first memory attachment position information; and determining the second data transfer rate setting value based at least in part upon the second memory attribute information and the second memory attachment position information.

12. The apparatus of claim 8, wherein the memory comprises additional instructions for:

acquiring a first upper limit temperature at which the first memory module is operated externally through a host controller;

acquiring a second upper limit temperature at which the second memory module is operated externally through the host controller;

determining the first data transfer rate setting value based at least in part upon the first upper limit temperature; and determining the second data transfer rate setting value based at least in part upon the second upper limit temperature.

13. The apparatus of claim 8, further including determining the first and second data transfer rate setting values according to a heating value, wherein the heating value is determined in accordance with a total number of memory devices implemented in the memory module, an implementation state of the memory devices, a type of the memory devices, and a manufacturer of the memory devices.

14. A computer-readable medium comprising computer-executable instructions for:

acquiring memory attribute information for each memory module in a plurality of memory modules, wherein each of the memory modules include an attribute memory that retains the memory attribute information;

accessing a setting value candidate database;

locating candidate data transfer rate setting values for each memory module in the plurality of memory modules in the setting value candidate database, wherein the candidate data transfer rate setting values correspond to the acquired memory attribute information in the setting value candidate database;

obtaining current data transfer rates for the each of the memory modules in the plurality of memory modules, wherein the current data transfer rate is the data transfer rate currently being used to transfer data;

comparing the current and the candidate data transfer rates; and determining a data transfer rate setting value that is to be applied with respect to each memory module in the plurality of memory modules based at least in part upon the comparison; and outputting the selected data transfer rate setting value to a host controller that controls data transfer with respect to the plurality of memory modules.

15. The computer-readable medium of claim 14 comprising further computer-executable instructions for:

determining which of the located candidate data transfer rate setting value is lowest; and selecting the lowest candidate data transfer rate setting value as the value to be output to the host controller.

16. The computer-readable medium of claim 14, further comprising:

acquiring memory position information for each memory module in the plurality of memory modules, wherein the memory position information indicates to which memory slots of an information processing apparatus each of the memory modules is attached; and locating the candidate data transfer rate setting values for each memory module in the plurality of memory modules in the setting value candidate database, wherein the candidate data transfer rate setting values correspond to the acquired memory attribute information and the acquired memory position information in the setting value candidate database.

* * * * *